(12) United States Patent
Fournier et al.

(10) Patent No.: US 9,379,024 B2
(45) Date of Patent: Jun. 28, 2016

(54) METHOD FOR MANUFACTURING A MICROELECTRONIC DEVICE INCLUDING DEPOSITING IDENTICAL OR DIFFERENT METALLIC LAYERS ON THE SAME WAFER

(71) Applicant: COMMISSARIAT A L'ENERGIE ATOMIQUE ET AUX ENE ALT, Paris (FR)

(72) Inventors: Claire Fournier, Pont-Saint-Esprit (FR); Frederic-Xavier Gaillard, Voiron (FR); Fabrice Nemouchi, Moirans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/591,273

(22) Filed: Jan. 7, 2015

(65) Prior Publication Data

US 2015/0194349 A1    Jul. 9, 2015

(30) Foreign Application Priority Data

Jan. 8, 2014   (FR) ..................................... 14 50128

(51) Int. Cl.
 *H01L 21/8238*    (2006.01)
(52) U.S. Cl.
 CPC ... *H01L 21/823821* (2013.01); *H01L 21/823807* (2013.01); *H01L 21/823814* (2013.01)
(58) Field of Classification Search
 CPC .............. H01L 21/823821; H01L 21/823807
 See application file for complete search history.

(56) References Cited

U.S. PATENT DOCUMENTS

| | | | |
|---|---|---|---|
| 5,364,459 A | 11/1994 | Senda et al. | |
| 6,933,231 B1 | 8/2005 | Tiwari | |
| 2004/0137670 A1 | 7/2004 | Chen et al. | |
| 2005/0079726 A1 | 4/2005 | Chen et al. | |
| 2005/0156208 A1 | 7/2005 | Lin et al. | |
| 2006/0121662 A1 | 6/2006 | Fang et al. | |
| 2006/0121664 A1 | 6/2006 | Fang et al. | |
| 2006/0121665 A1 | 6/2006 | Fang et al. | |
| 2006/0172495 A1* | 8/2006 | Zhu ........................ | G01L 21/84 438/275 |
| 2009/0315185 A1 | 12/2009 | Boyanov et al. | |

(Continued)

OTHER PUBLICATIONS

French Preliminary Search Report issued Sep. 24, 2014, in French Application No. 14 50128 filed Jan. 8, 2014 (with Written Opinion and English Translation of Categories of Cited Documents).

(Continued)

*Primary Examiner* — Mamadou Diallo
(74) *Attorney, Agent, or Firm* — Oblon, McClelland, Maier & Neustadt, L.L.P (57) ABSTRACT

A method for manufacturing a microelectronic device is provided, including forming a first semiconductor material layer on a first region of a top surface of a substrate; and forming a second semiconductor material layer on a second region of the top surface of the substrate distinct from the first region, forming a first metallic layer above the first layer; forming a first contact layer of a first intermetallic compound or solid solution; forming a first sacrificial layer in an upper portion of the first contact layer; forming a second sacrificial layer in an upper portion of the second layer; removing all of the second sacrificial layer so as to expose a residual portion of the second layer; partially removing the first sacrificial layer; forming a second metallic layer above said residual portion; and forming a second contact layer of a second intermetallic compound or solid solution.

17 Claims, 5 Drawing Sheets

(56) References Cited

U.S. PATENT DOCUMENTS

2010/0219475 A1* 9/2010 Kronholz ........ H01L 21/823807
257/351
2013/0285153 A1 10/2013 Lee et al.

OTHER PUBLICATIONS

R. D. Frampton, et al. "A study of the oxidation of selected metal silicides", AIP Journal of Applied Physics, 62, 2972, 1987, 10 pgs.

M. Bartur, et al., "Thermal oxidation of nickel disilicide", Appl. Phys. Lett., 40(2), Jan. 15, 1982, 3 pgs.

A. Shibata, et al., "Pd-Ni-P metallic glass film fabricated by electroless alloy plating", Thin Solid Films 517, 2009, 4 pgs.

L. N. Lie, et al., "Thermal oxidation of silicides", AIP Journal of Applied Physics, 56, 2127, 1984, 7 pgs.

P. Rosser, et al., "Silicides for VLSI interconnects", Vacuum, vol. 35, No. Oct. 10-11, 1985, 16 pgs.

* cited by examiner

METHOD FOR MANUFACTURING A MICROELECTRONIC DEVICE INCLUDING DEPOSITING IDENTICAL OR DIFFERENT METALLIC LAYERS ON THE SAME WAFER

TECHNICAL FIELD OF THE INVENTION

The present invention concerns a method for manufacturing microelectronic devices of various types on the same wafer and, more particularly, a method for forming identical or different metallic layers and thus contact layers of said microelectronic devices that are different while making the contact layers more homogeneous and uniform in terms, for example, of thickness, composition, roughness, etc.

PRIOR ART

The performances of CMOS (the acronym for complementary metal oxide semiconductor) microelectronic devices are closely linked to the reduction in the resistance of the electrical contacts. Improving the autoaligned siliciding method is one of the keypoints for achieving the characteristics required for the future technological node. The siliciding method is in fact a reaction between a metallic layer and a semiconductor layer making it possible to limit the resistance of access to the source and drain of a transistor. The material of the metallic layer may be chosen from metals and alloys such as a nickel-based alloy.

At the present time, the metallic layer enabling the siliciding reaction is generally produced by physical vapour deposition (PVD) over the whole of the continuous top surface of the wafer supporting the devices to be manufactured. Next, under the effect of heat treatment, the metallic layer reacts preferentially with semiconductor regions rather than with dielectric regions. At this step, the annealing forming a layer of silicide is performed.

A selective removal is then carried out preferentially by a chemical method in order to remove the portion of the metallic layer that has not reacted. A further heat treatment is carried out in order to obtain directly a layer of an intermetallic compound or a solid solution, which is the most interesting phase from a metallurgical and electrical point of view.

However, the above method has major drawbacks presented below:

(1) Numerous steps are necessary before performing the siliciding.
(2) This method involves a high consumption of metal, resulting from the step of depositing the metallic layer on the entire surface of the wafer and the step of selective removal for removing the parts of the metallic layer that have not reacted during the first heat treatment. A large portion of the metallic layer is therefore lost.
(3) The uniform deposition of the metallic layer at the trench bottom with a high aspect ratio is difficult to perform by a PVD method.
(4) The deposition carried out by the PVD method creates a shadow effect according to the density of the patterns.
(5) Deposition by the PVD method carried out conventionally does not, except in the case of masking, make it possible to deposit different metals (or metal alloys) on the various contact-takeup regions.

In order to remedy the above drawbacks in whole or in part, another solution proposes a method for forming a metallic layer by chemical method and more particularly by autocatalytic method without the provision of current ("electroless deposition"), also referred to as non-assisted electrochemical method, instead of the PVD method.

This method makes it possible to deposit a metallic layer (or a layer of an alloy material) at low cost on the top surface of the wafer or inside complex structures. Moreover, this method makes it possible, subject to certain specific conditions, to deposit not a metallic layer but two different metallic layers selectively according to the substrate employed.

According to various substrate natures, it is also difficult to obtain an identical metallic layer on devices integrating different substrates such as substrates of semiconductor materials differently doped by different types of dopant and/or having different concentrations, or even different semiconductor materials. This is because the morphology (i.e. the roughness, the grain size, the grain density) and/or the critical thickness (i.e. the thickness as from which the metallic layer is continuous) will be different according to the materials used, which will give rise to difficulties of integration of this method in the devices since a direct relationship exists between the characteristics of the metallic layers and the performance of the contacts formed subsequently; for example:

high roughness leads to an increase in resistance;
non-uniform thickness of the metallic layer leads to a sequence of different formed phases or non-uniform thicknesses over the whole of the wafer and therefore potentially to an undesired variation in the series resistances;
the impossibility of forming two different metallic layers.
The flexibility in the choice of the materials for the metallic layers and the flexibility in the conductivities required for the contact layers obtained are limited.

There therefore exists a need for a method for optimising the deposition of two identical or different metallic layers for a given substrate, the method being adapted to substrates comprising different materials on the surface.

SUMMARY OF THE INVENTION

The present invention makes it possible to remedy all or some of the technical drawbacks currently known.

In particular, one aspect of the invention relates to a method for manufacturing a microelectronic device comprising, on the base of a substrate, formation of a first layer of a first semiconductor material on a first region of a top surface of the substrate; formation of a second layer of a second semiconductor material, on a second region, distinct from the first region, of the top surface of the substrate; formation of a first metallic layer above the first layer; formation of a first contact layer of a first intermetallic compound or solid solution comprising at least one portion of the first layer and at least one portion of the first metallic layer; formation of a first sacrificial layer by oxidation, over a thickness $e_1$, of an upper portion of the first contact layer, and the formation of a second sacrificial layer by oxidation, over a thickness $e_2$, of an upper portion of the second layer; the removal of the whole of the second sacrificial layer so as to expose a residual portion of the second layer and partial removal of the first sacrificial layer; formation of a second metallic layer above said residual portion; formation of a second contact layer of a second intermetallic compound or solid solution comprising at least one portion of said residual portion and at least one portion of the second metallic layer.

One potential advantage of the invention is to overcome at least partly the problems mentioned above by depositing two identical or different metallic layers and making uniform the layers of various semiconductor materials on the same wafer; for example, to form two p-type and n-type CMOS transistors, the invention affording an advantageous advantage of depositing two different metallic layers where the difference between the value of the valence band for a p-type semiconductor and the output work value of the silicide is less than a half-gap (or "a forbidden half-band") of this same semiconductor and where the difference between the output work value of the silicide and the value of the conduction band for an n-type semiconductor is less than a half-gap of this same semiconductor.

BRIEF DESCRIPTION OF THE FIGURES

The aims, objects, features and advantages of the invention will emerge more clearly from the detailed description of an embodiment of it that is illustrated by the following accompanying drawings, in which.

The drawings are given by way of examples and are not limitative of the invention. They constitute outline schematic representations intended to facilitate understanding of the invention and are not necessarily to the scale of the practical applications. In particular, the relative thicknesses of the various layers and films do not represent reality.

DETAILED DESCRIPTION

The invention relates to the manufacture of any device such as in particular those indicated previously. These manufactures involve substrates, here defined as structures with at least one layer of material, highly advantageously of the semiconductor type, and forming a stack or wafer of semiconductor material or materials. The substrate may form all or part of the final microelectronic device or be an intermediate element at least partially eliminated during manufacture, for example serving as a support or handle for the implementation and/or transfer of functional layers. Top surface of the substrate means a part of the substrate exposed towards the outside and typically one of the two faces delimiting the thickness of the substrate.

The top surface is advantageously non-planar because of the presence of parts of devices or masks, for example. A portion or region of the top surface may therefore be hollow or protruding relative to other portions or regions of the top surface.

The term "thickness" is used to define a dimension in the direction of the stacks of layers of the manufactured device. The term "width" is used to describe a dimension orientated transversely to the thickness.

The terms of the type "above, on top of, superimposed, underlying" or equivalent serve to describe a relative position of two parts of the device along the thickness dimension of it. They do not routinely imply that the parts in question are in contact and, for example, immediately above or below.

The expressions of the type "equal, less, greater" mean comparisons between quantities, these comparisons being able to accommodate certain tolerances, in particular according to the scale of the values compared and the uncertainties of measurement. Substantially equal, inferior or superior values fall within the scope of interpretation of the invention.

In order to begin a detailed review of embodiments of the invention, optional features are stated below, which may optionally be used in accordance with all associations or alternatively:

the thickness of the first sacrificial layer is greater than the thickness of the second sacrificial layer;

the formations of the first and second sacrificial layers comprise respectively the performance of a heat treatment;

the heat treatment is carried out for a period of 2 to 100 hours and at a temperature of between 700° C. and 1200° C. so as to form the first and second sacrificial layers;

the method comprises, after the formation of the second contact layer, the effecting of a total removal of the first sacrificial layer;

the first and second sacrificial layers are removed by chemical attack;

the formations of the first and second contact layers comprise the carrying out of a heat treatment;

the heat treatment is carried out for a period of 10 to 600 seconds and at a temperature of between 150° C. and 500° C. so as to form the first and second contact layers. The heat treatment is preferentially a rapid thermal annealing RTP ("rapid thermal process"), or a laser annealing in a neutral gas such as argon (Ar), helium (He) or nitrogen ($N_2$) or by means of a reducing agent such as gaseous hydrogen ($H_2$). Said heat treatment is performed at a pressure between for example 1 and 2 atm (atmospheres);

the first metallic layer and the second metallic layer are made from different materials;

the first semiconductor material and the second semiconductor material are different;

the first metallic layer is formed preferentially by selective deposition outside regions comprising dielectric regions of the top surface of the substrate and the second layer of the second semiconductor material;

the second metallic layer is preferentially formed by selective deposition outside regions comprising dielectric regions of the top surface of the substrate and those of the sacrificial layer. In another embodiment, this deposition of the second metallic layer may be carried out non-selectively, for example by PVD deposition. In this case, the second metallic layer is situated over the entire top surface of the wafer;

at least one from among the first and second metallic layers is formed by assisted electrochemical method;

the thickness of the first metallic layer and that of the second metallic layer are greater than 5 nm. At least one of the first and second semiconductor materials is chosen from the following materials: silicon, a solid solution of silicon containing carbon, a solid solution of silicon or germanium, germanium, silicon-germanium or III-V materials composed of elements from columns III and/or V of the standard periodic table of elements;

the first and second semiconductor materials are chosen from the following materials: silicon, a solid solution of silicon containing carbon, a solid solution of silicon or germanium;

the first and second semiconductor materials are chosen from the III-V materials composed of elements from columns III and/or V of the standard periodic table of elements.

Figure 1A:
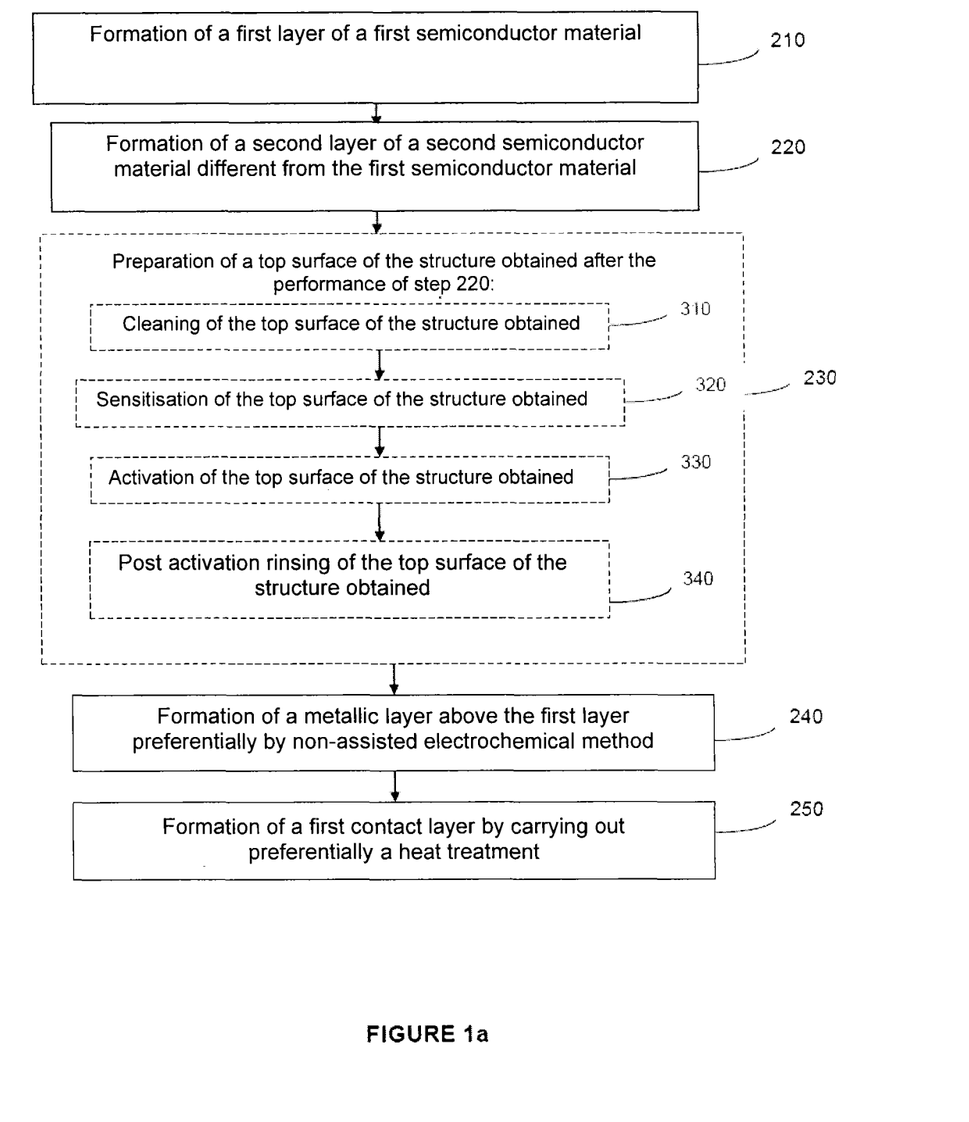
FIGS. 1a and 1b summarise steps of manufacturing microelectronic devices according to the method of the invention.
Figure 1B:
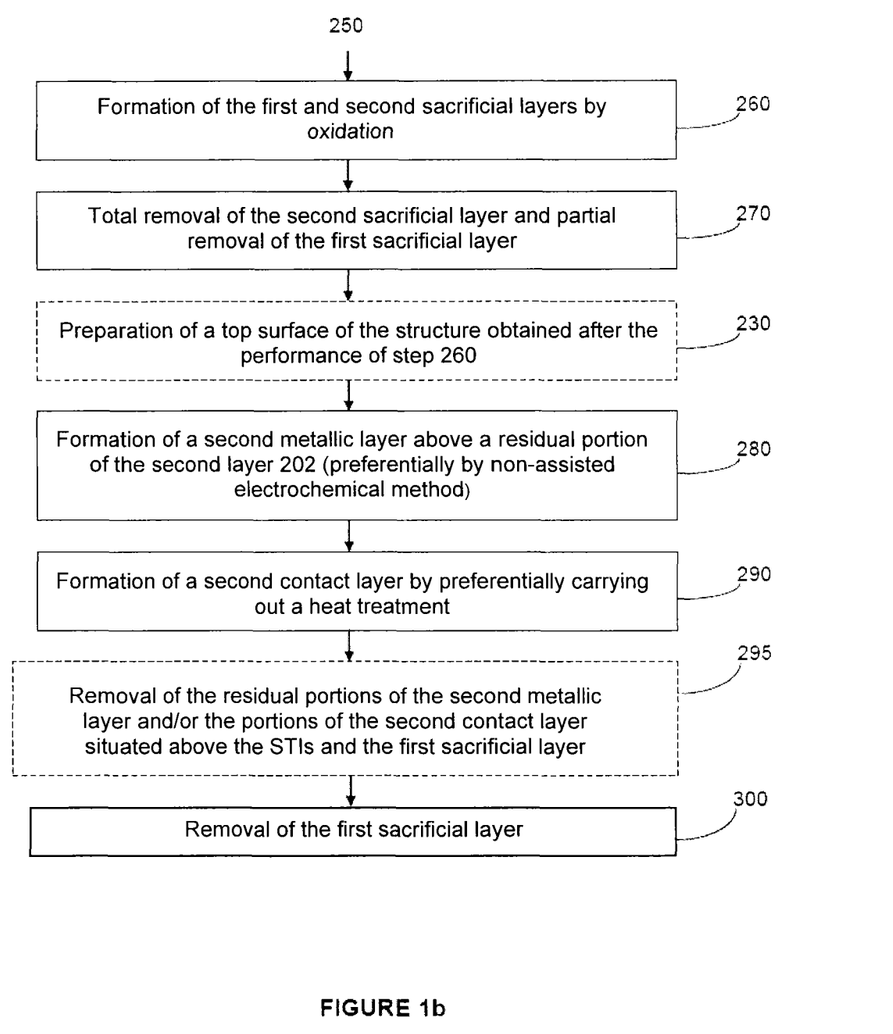

FIGS. 1a and 1b summarise the steps 210 to 300 of manufacturing microelectronic devices according to the method of the invention. FIGS. 2a to 2i illustrate the main steps 210 to 300 of manufacturing transistors of two different types on the same wafer, also referred to as the substrate, according to a first embodiment of the invention. Two transistors 101 and 102, respectively of the NMOS and PMOS type, will be illustrated in FIGS. 2a to 2i in order to facilitate understanding. The invention is not limited to the number of transistors illustrated and some of the layers mentioned below may not be present or other layers may be added without departing from the scope of the present invention.

Figure 2A:
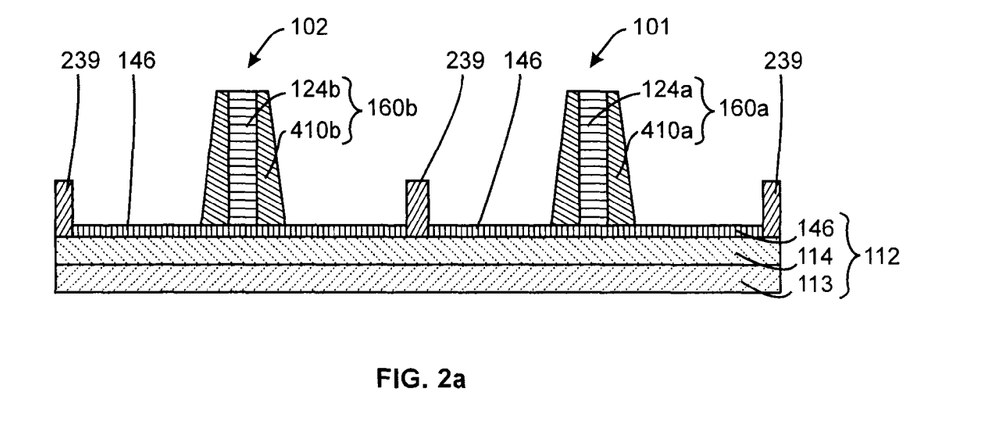
FIGS. 2a to 2i show structures obtained at the end of the main steps of manufacturing transistors of two different types, producing two identical or different metallic layers on the same wafer according to a first embodiment of the invention.

FIG. 2a shows the starting structure of a substrate 112 according to a first embodiment of the invention.

The integrated circuits such as the transistors 101, 102 can be produced from a starting substrate, very generally made from solid silicon and often referred to by the English term "bulk", or an elaborate substrate of the so-called SOI type, the acronym for the English "silicon on insulator" and more generally "semiconductor on insulator".

In FIG. 2a there is the substrate 112 of the SOI type comprising an initial substrate 113 surmounted by an insulating layer 114 and a superficial layer 146. The initial substrate 113 is usually a homogeneous wafer of silicon. The insulating layer 114 is preferentially a buried oxide layer 114 that provides the insulation of the components that will be manufactured in the fine superficial layer 146 of semiconductor present on the buried layer 114. The superficial layer 146 usually consists of monocrystalline silicon. The insulation of the transistors 101, 102 is completed by the production of lateral isolation trenches 239, referred to as STI, the acronym for "shallow trench isolation". They reach the buried oxide layer 114 in order to enclose each of the transistors in a continuous layer of oxide 114. These trenches, which are not necessary to an understanding of the invention, are not depicted in detail.

A stack of gates 160a, formed on the superficial layer 146, comprises at least one gate 124a, a hard mask (not illustrated in the figures) covering the top surface of the gate 124a and spacers 410a covering the flanks of the gate 124a. A stack of gates 160b, also formed on the superficial layer 146, comprises at least one gate 124b, a hard mask (not illustrated in the figures) covering the top surface of the gate 124b and spacers 410b covering the flanks of the gate 124b. Said hard masks are configured so as to protect the gates 124a, 124b during the formation of the sources and drains such as layers 201, 202 (illustrated subsequently) by epitaxy or implantation of n and p junctions. Said hard masks are also used during the performance of the step 230 (illustrated subsequently) of formation of an intermediate coating 205.

The material of the gate 124a may be different from that of the gate 124b. The material of the spacers 410a may also be different from that of the spacers 410b. These stacks of gates 160a, 160b, which are not necessary to an understanding of the invention, are not depicted in detail.

The invention is not limited to the above example embodiments of the preparation of a substrate 112, the STIs 239, the formations of the gate stacks 160a, 160b and preparation of the top surface of the superficial layer 146 of the substrate 112.

Figure 2B:
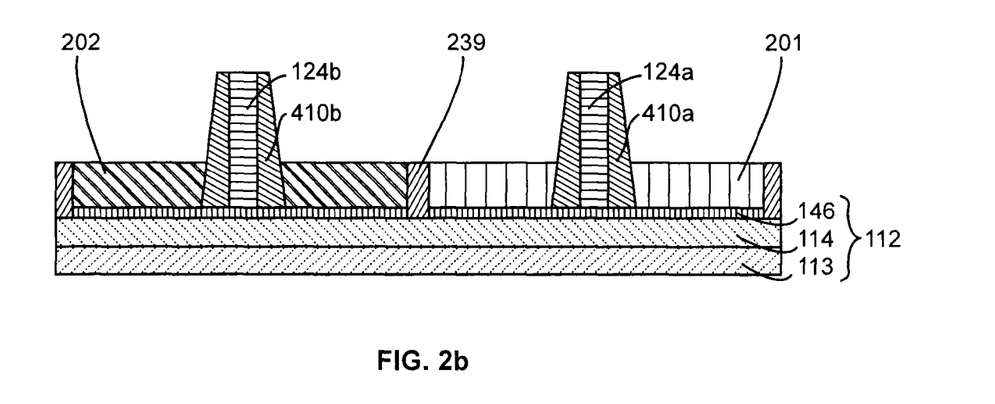

FIG. 2b shows the structure obtained at the end of the step 210 of formation of a first layer 201 of a first semiconductor material and a second layer 202 of a second semiconductor material, respectively on a first region for the transistor 101 and a second region for the transistor 102.

Preferentially but non-limitatively, step 210 consists first of depositing a mask (not illustrated in FIG. 2b) and next forming the first layer 201 on the first region of the top surface of the substrate 112 outside the stack of gates 160a. It should be noted that the term "region" may apply to any surface part with any forms and dimensions suited to the application. It may be in one or more portions spaced apart.

In order to form the first layer 201, a mask is preferentially deposited outside the first region of the top surface of the substrate 112 so that the first layer 201 is formed only in the first region of the top surface of the substrate 112. More precisely, the mask is preferentially deposited on a second region of the top surface of the substrate 112 in order to cover entirely and thus protect the stack of gates 160b and the second region of the top surface of the superficial layer 146. The material of the mask is for example $SiO_2$.

The first layer 201 is next formed on the first region by a method such as selective epitaxy of the first semiconductor material. This first layer 201 is intended to participate in the formation of a first contact layer 281 (described subsequently). This first semiconductor material is advantageously different from a second semiconductor material used for subsequently forming another contact layer 282 (described subsequently).

By way of example, for the CMOS integrations normally encountered, the first layer 201 is composed either of n-type silicon (Si) or a solid solution containing carbon (C), a second layer 202 being composed of p-type Si or SiGe.

In addition, in another example, the first layer 201 is composed of p-type Si or SiGe, the second layer 202 being composed of n-type Si or a solution of Si containing carbon.

It should also be noted that the invention is not limited to the order of production of the layers 201, 202 or to the above examples. The first and second semiconductor materials may be identical or different depending on the methods for producing the layers 201 and 202 and/or the functions of the transistors 101 and 102.

According to this embodiment, preferentially but non-limitatively, at least one from among the first and second semiconductor materials is chosen from the following materials: silicon, a solid solution of silicon containing carbon, germanium, silicon-germanium, or materials composed of elements from columns III and/or V in the periodic classification of elements, according to requirements.

Thus the first layer 201 is formed on either side of the stack of gates 160a on the first region of the substrate 112. Preferentially but non-limitatively, the thickness of the first layer 201 is 5 to 20 nm (nanometres).

The mask is next removed after the formation of the first layer 201.

Preferentially, the second layer 202 can be produced in the same way as the first layer 201 is formed. The step 210 therefore consists of next depositing a mask (not illustrated in FIG. 2b) and forming the second layer 202 on the second region of the top surface of the substrate 112 outside the stack of gates 160b.

Before forming the second layer 202, a mask is preferentially deposited outside the second region of the top surface of the substrate 112 so that the second layer 202 is formed only in the second region of the top surface of the substrate 112. More precisely, the mask is preferentially deposited on a first region of the top surface of the substrate 112 in order to entirely cover and thus protect the stack of gates 160a and the first region of the top surface of the superficial layer 146. The material of the mask is for example $SiO_2$.

The formation of the second layer 202 is then effected in the same way as the selective epitaxy of the second semiconductor material. For the record, the second semiconductor material is advantageously different from the first semiconductor material.

Thus the second layer 202 is formed on either side of the stack of gates 606b on the second region of the substrate 112. Preferentially but non-limitatively, the thickness of the second layer 202 is 5 to 20 nm.

The mask is removed after the formation of the second layer 202.

The invention is not limited to the production of the masks or to the example embodiments of the first and second layers 201 and 202.

Figure 2C:
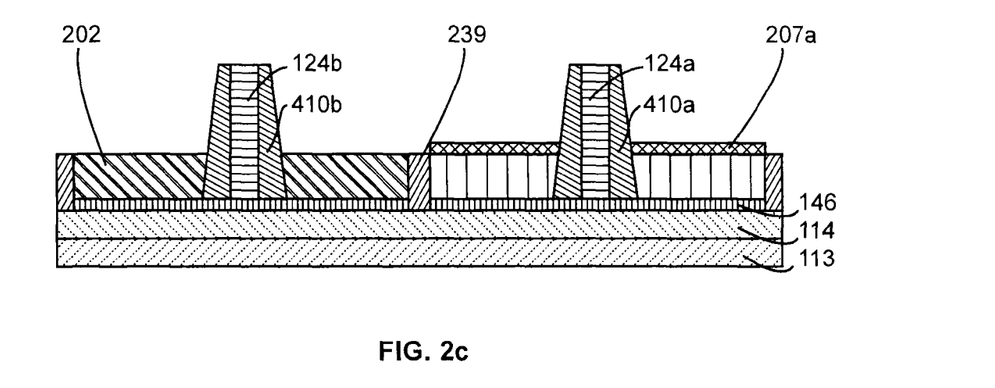

FIG. 2c shows the structure obtained at the end of the step 240 of formation of a metallic layer 207a for the transistor 101.

In order to facilitate the performance of step 240, a step 230 of preparation of the top surfaces of the first and second layers 201 and/or 202 is performed before step 240.

This step 230 is optional according to the nature of the first material and the types of device to be produced. An example embodiment of the step 230 composed of four steps 310 to 340 will be illustrated below. The invention is not limited to the embodiments of the optional step 230; that is to say step 230 does not necessarily comprise all the four steps 310 to 340 and could be performed otherwise.

Step 310 consists of cleaning the top surface of the structure obtained after the performance of step 220, comprising the top surfaces of the first and second layers 201 and/or 202. A cleaning solution, for example hydrofluoric acid, is used at this step.

The step 320 of sensitisation of the top surfaces of the first and second layers 201 and/or 202 is performed using a sensitisation solution, for example an acidic solution of tin salt. This sensitisation solution may also contain an additive modifying the adsorption properties of the tin ions.

An example of formation of the composition of the sensitisation solution is described in the following table:

| Aqueous solution | $SnCl_2$ (tin(II) chloride), $2H_2O$ | HCl (hydrogen chloride) | $H_2O$ |
|---|---|---|---|
| | 2.26 g (grams) | 0.8 ml (millilitres) | 100 ml |

The step 330 of activation of the top surfaces of the first layer 201 and/or of the second layer 202 is then performed using an activation solution, for example of palladium. The composition of the activation solution may be varied and adapted according to the nature of a first semiconductor material to be used.

The selectivity of a deposition of a metallic layer formed subsequently (for example the metallic layer 207a formed at the following step 240 or the second metallic layer 207b formed at step 280) can be adjusted via an activation bath used at this stage, either by modifying the composition of the bath or by modifying the concentrations of the reagents.

Here are examples of activation solutions that can be used for preparing the top surfaces of the first and second layers 201 and/or 202 for a deposition of nickel. Three examples of formation of the composition of the activation solution are described in the following three tables for explaining in which cases the activation solutions are used according to their activation properties on various materials:

First example: application of the activation solution to n-type silicon:

| | $Si_xN_y$ | $SiO_x$ | SiGe | Si n (As) | Si n (P) | Si p | Si p+ |
|---|---|---|---|---|---|---|---|
| $PdCl_2$ (palladium(II) chloride) + AcOH (acetic acid) | No | No | No | Yes | Yes | No | No |

Second example: application of the activation solution to type n or p silicon:

| | $Si_xN_y$ | $SiO_x$ | SiGe | Si n (As) | Si n (P) | Si p | Si p+ |
|---|---|---|---|---|---|---|---|
| $PdCl_2$ + HF + AcOH | No | No | No | Yes | Yes | Yes | Yes |

Third example: application of the activation solution to silicon of type n or p, SiGe, silicon oxide ($SiO_x$) and silicon nitride ($Si_xN_y$):

| | $Si_xN_y$ | $SiO_x$ | SiGe | Si n (As) | Si n (P) | Si p | Si p+ |
|---|---|---|---|---|---|---|---|
| $PdCl_2$ | Yes | Yes | Yes | Yes | Yes | Yes | Yes |

The activation solution is advantageously configured to activate the regions of the top surface of one from among the first and second layers 201 and 202 on which two metallic layers 207a, 207b are to be formed, and preferentially so as not to activate regions such as the dielectric parts and the top surface of the other one of the layers 201, 202. This makes it possible to make the formation of the first and second metallic layers 207a, 207b selective. Next, the step 340 of post-activation rinsing of the top surfaces of the first and/or second layers 201 and/or 202 is performed. This step 340 can be performed in various ways such as an EDI (the abbreviation of "electrodeionisation") rinsing only, EDI under ultrasound rinsing, or rinsing carried out in successive EDI/HF/EDI baths. This step 340 optimises the implementation of the following step 240 comprising for example a deposition of nickel (Ni) by non-assisted electrochemical method, and this according to the integration and the substrate.

Next, the step 240 of formation of a first metallic layer 207a for the transistor 101 is performed. This step 240 consists of forming the first metallic layer 207a above the first layer 201, preferentially but non-limitatively by non-assisted electrochemical method ("electroless deposition"). A solution used in a bath containing for example a metal salt, a reducing agent, a complexing agent and a stabiliser is used in order to effect a chemical reaction in order then to form the first metallic layer 207a. For example, the first metallic layer 207a of material based on nickel (Ni) is obtained at the end of the implementation of a nickel bath by non-assisted electrochemical method using a solution such as a commercial solution comprising a metal salt, a reducing agent, a complexing agent and a stabiliser.

In addition, depending on the nature of the first n-type layer 201, use will advantageously be made of a deposition of nickel alloy based on rare earths in proportions by weight preferentially between 0% and 20%.

The conditions for implementing a bath, such as the temperature and pH, depend on the factors of the commercial solution or the formulated solution such as the composition of the bath, the concentration of the various constituents of the baths, etc. Let us take the above example; the chemical reaction is performed between 60° and 80° C. depending on the substrates 112 used and preferentially between 70° and 75° C.

The material of the first metallic layer 207a may be a metal or an alloy, depending on the chosen solution to be applied.

The thickness of the first metallic layer 207a is determined according to that of the first layer 201. More precisely, the thickness of the first metallic layer 207a should be less than that of the first layer 201.

The thickness of the first metallic layer 207a is preferentially greater than a threshold thickness (i.e. between 1 and 20 nm).

In order to determine said threshold thickness of the first metallic layer 207a, one possibility is to calculate the volume $V_{at}^i$ of an atom of the material for each layer i such that an upper portion (RI) of the first layer 201 intended to make the first metallic layer (CM) 207a and the first contact layer (CC) 281 (formed subsequently at step 250) react with the first metallic layer 207a. The values $V_{at}^i$ for the above three layers are therefore respectively represented as $V_{at}^{RI}, V_{at}^{CM}, V_{at}^{CC}$.

An example of a calculation on the value $V_{at}^i$ is presented in the following formulae:

$$V_{at}^i = V_{Ma}^i / N_{at}^i$$

where $V_{Ma}^i$ represents the volume of the crystalline mesh of the material of the layer i and $N_{at}^i$ represents the number of atoms per mesh of the material in the layer i.

Two examples of calculation of the value $V_{Ma}^i$:
  Cubic phase: $V_{Ma}^i = a^3$
  Orthorhombic phase: $V_{Ma}^i = a*b*c$ Where a, b and c represent the mesh parameters.

Thus the values $V_{at}^{RI}, V_{at}^{CM}, V_{at}^{CC}$ can be obtained and, consequently, said threshold thickness of the first metallic layer 207a can be obtained by calculating the volume ratio such as $V_{at}^{CM}/V_{at}^{RI}$ presented in the following table:

| RI (upper portion (RI) of the first layer 201) | + | CM (first metallic layer 207a) | → | CC (first contact layer 281) |
|---|---|---|---|---|
| $V_{at}^{RI}$ | | $V_{at}^{CM}$ | | $V_{at}^{CC}$ |
| 1 | | $V_{at}^{CM}/V_{at}^{RI}$ | | $V_{at}^{CC}/V_{at}^{RI}$ |

The following table presents two numerical examples where the first semiconductor material of the intermediate coating 205 is silicon:

| | RI (upper portion (RI) of the first layer 201) | + | CM (first metallic layer 207a) | → | CC (first contact layer 281) |
|---|---|---|---|---|---|
| Material | 2 Si | | Ni | | NiSi$_2$ |
| Volume ratio | 1 | | $V_{at}^{CM}/(2 \times V_{at}^{RI})$ = 0.27 | | $V_{at}^{CC}/(2 \times V_{at}^{RI})$ = 1.97 |
| Material | Si | | Ni | | NiSi |
| Volume ratio | 1 | | $V_{at}^{CM}/V_{at}^{RI}$ = 0.55 | | $V_{at}^{CC}/V_{at}^{RI}$ = 1.2 | where:

$$V_{at}^{Ni} = (3.535 \cdot 10^{-10})^3 / 4 = 1.10435 \cdot 10^{-29}$$

$$V_{at}^{Si} = (5.4309 \cdot 10^{-10})^3 / 8 = 2.00228 \cdot 10^{-29}$$

$$V_{at}^{NiSi2} = (5.406 \cdot 10^{-10})^3 / 4 = 3.94974 \cdot 10^{-29}$$

$$V_{at}^{NiSi} = (5.23 * 3.258 * 7.04 \cdot 10^{-10})/4 = 2.41202 \cdot 10^{-29}$$

The following table presents more numerical examples if the first semiconductor material of the first layer 201 is silicon:

| RI (upper portion (RI) of the first layer 201) | CM (first metallic layer 207a) | CC (first contact layer 281)/silicide formed |
|---|---|---|
| Si | Ni | NiSi |
| 1 | 0.55 | 1.2 |
| 2 Si | Ni | NiSi$_2$ |
| 1 | 0.27 | 1.97 |
| Si | 2 Pd | Pd$_2$Si |
| 1 | 1.47 | 1.76 |
| Si | Pt | PtSi |
| 1 | 0.74 | 1.47 |
| Si | 2 Co | Co$_2$Si |
| 1 | 1.1 | 1.61 |
| 2Si | Ti | TiSi$_2$ |
| 2.24 | 0.45 | 1.11 |

The following table presents numerical examples if the first semiconductor material of the first layer 201 is germanium:

| RI (upper portion (RI) of the first layer 201) | CM (first metallic layer 207a) | CC (first contact layer 281)/germanide formed |
|---|---|---|
| Ge | Ni | NiGe |
| 1 | 0.46 | 0.41 |
| Ge | 2 Ni | Ni$_2$Ge |
| 1 | 0.97 | 0.62 |
| Ge | Pd | PdGe |
| 1 | 0.65 | 0.43 |
| Ge | Pt | PtGe |
| 1 | 0.67 | 0.45 |

To facilitate understanding, three examples of a sequence for performing steps 230 (comprising steps 310 to 340) and 240 are briefly described below. Several fluids, as indicated in the following three tables, are advantageously applied successively to the top surfaces of the first and second layers 201 and/or 202.

The usable parameters respectively corresponding to each fluid are also indicated in the following tables of successive phases. The application of the fluids begins with the acid and ends with deionised water (DIW) or water $H_2O$.

The first example of a sequence for performing steps 230 (comprising steps 310 to 340) and 240:

| Aqueous solution | 1% HF (hydrofluoric acid) | $Sn^{2+}$ | $H_2O$ | $Pd^{2+}$ | $H_2O$ | $Ni^{2+}$ | DIW |
|---|---|---|---|---|---|---|---|
| Duration (seconds) | 10 | 600 | 10 | 120 | 10 | 30 | 10 |
| Temperature (° C.) | Ambient temperature (AT) | AT | AT | AT | AT | 75 | AT |

The second example:

| Aqueous solution | 1% HF | $Sn^{2+}$ | $H_2O$ | $Pd^{2+}$ | $H_2O$ | 0.1% HF | $H_2O$ | $Ni^{2+}$ | $H_2O$ |
|---|---|---|---|---|---|---|---|---|---|
| Duration (seconds) | 10 | 600 | 10 | 30 | 10 | 10 | 10 | 20 | 10 |

-continued

| Aqueous solution | 1% HF | $Sn^{2+}$ | $H_2O$ | $Pd^{2+}$ | $H_2O$ | 0.1% HF | $H_2O$ | $Ni^{2+}$ | $H_2O$ |
|---|---|---|---|---|---|---|---|---|---|
| Temperature (° C.) | Ambient temperature (AT) | AT | AT | AT | AT | AT | AT | 75 | AT |

The third example:

| Aqueous solution | 1% HF | $Sn^{2+}$ | $H_2O$ | $Pd^{2+}$ | $H_2O$/US | $Ni^{2+}$ | $H_2O$ |
|---|---|---|---|---|---|---|---|
| Duration (seconds) | 10 | 600 | 10 | 120 | 120 | 30 | 10 |
| Temperature (° C.) | Ambient temperature (AT) | AT | AT | AT | AT | 75 | AT |

At the end of this step 340, several functions, such as the elimination of the residues of solution used (i.e. the first example), the elimination of the palladium (i.e. the second example) on the silicon oxide ($SiO_x$) or silicon nitride ($Si_xN_y$) in order to obtain a deposit of nickel only on the semiconductor substrates (Si, SiGe), and improvement in the quality such as lower thickness and roughness of the first metallic layer 207a formed subsequently (by deposition of nickel for example), are obtained according to different embodiments.

Thus the first metallic layer 207a is therefore formed by selective deposition outside regions comprising dielectric regions of the upper surface of the substrate 112 and the second layer 202 of the second semiconductor material; more precisely the first metallic layer 207a is positioned above the first layer 201 of the first semiconductor material and formed around the stack of gates 160a and not on the second layer 202 and dielectric elements such as the STIs 239, the spacers 410a, 410b and the hard masks covering the gates 124a, 124b. For example, the selectivity depends on the solution of Pd used and/or the associated rinsing such as the three rinsings mentioned above in the description concerning step 340.

According to the invention, the stacks of gates 160a, 160b are preferentially not covered by the first metallic layer 207a, which makes it possible to reduce the quantity of material on the lost metallic layer compared with a known method.

For the record, according to a known PVD deposition method, the gate stacks are completely covered by a metallic layer. However, during a following annealing step (described below), the parts of the metallic layer covering the gate stacks will not react with dielectric regions such as the spacers 410a, 410b and the hard masks (not illustrated in the figures) covering respectively the upper surfaces of the gates 124a, 124b; that is to say said parts of the metallic layer are not required and will be lost, which will cause unnecessary consumption of the material of the metallic layers during the annealing step.

In addition, the sequence for manufacturing the devices is simplified since the method of the invention no longer routinely requires removing said parts of the metallic layer that has not reacted.

The invention is not limited to the materials or to the method for producing the first metallic layer 207a.

Figure 2D:
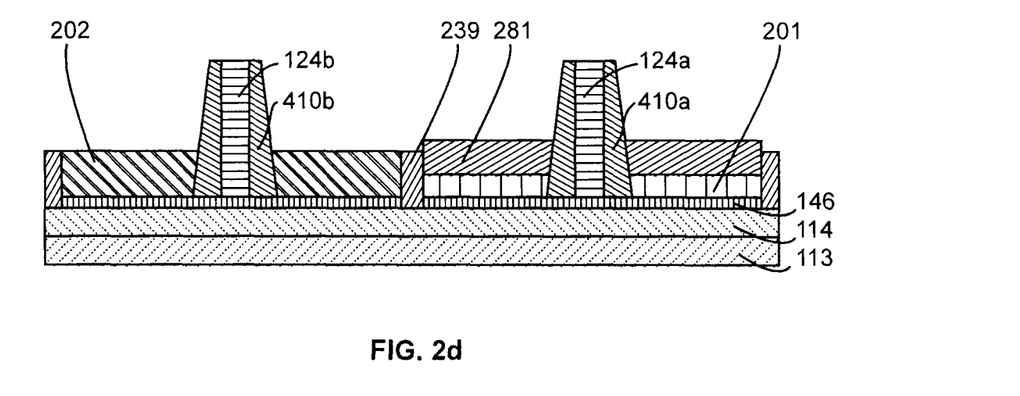

FIG. 2d shows the structure obtained at the end of the step 250 of forming a first contact layer 281 for the transistor 101. This contact layer 281 forms in general terms portions of devices, advantageously used for electrical conduction, issuing from the method of the invention.

Step 250 consists of preferentially performing a heat treatment so as to form the first contact layer 281 of a first intermetallic compound or solid solution, composed of the following two materials: the material of the first metallic layer 207a and of the first semiconductor material of at least one upper portion of the first layer 201.

The parameters of this annealing are determined according to the first semiconductor substrate and/or the material of the first metallic layer 207a used. The first intermetallic compound or solid solution obtained may be either an intermetallic compound (between a metal and a semiconductor material) or a metal/semiconductor alloy. It may typically be a case of a siliciding when the first semiconductor material is or comprises silicon.

Taking a preferential example where the first semiconductor material is chosen from silicon, silicon-germanium (SiGe) or silicon carbon (SiC), the heat treatment is carried out for example at a temperature of 150° C. to 500° C. for 10 to 120 seconds in order to cause a siliciding reaction and thus obtain the first intermetallic compound or solid solution.

The invention is not limited to the method for producing the first contact layer 281.

Figure 2E:
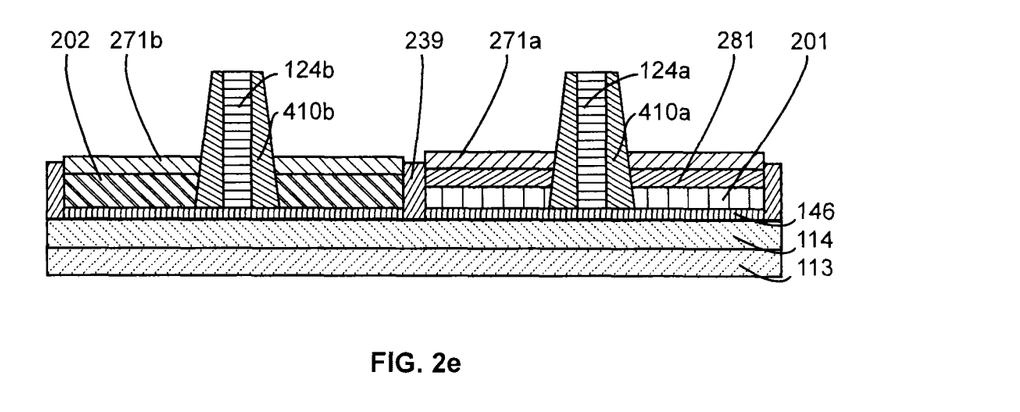

FIG. 2e shows the structure obtained at the end of the step 260 of forming the first and second sacrificial layers 271a, 271b by oxidation. This step 260 consists of preferentially carrying out a heat treatment in order to oxidise respectively an upper portion of the first contact layer 281 and an upper portion of the second layer 202, so as to form respectively the first sacrificial layer 271a with a thickness $e_1$ and the second sacrificial layer 271b with a thickness $e_2$.

The parameters of this annealing are determined according to several factors, such as the rate of oxidation of the first contact layer 281 and that of the second layer 202, the material obtained of the first contact layer 281 and/or the second semiconductor material of the second layer 202, etc. The rate of oxidation of the first contact layer 281 should advantageously be quicker than that of the second layer 202, in order to form the thickness $e_1$ which is greater than the thickness $e_2$.

Preferentially but non-limitatively, the thickness $e_2$ of the second sacrificial layer 271b may be very fine compared with the thickness $e_1$ of the first sacrificial layer 271a, which is for example at least twice $e_2$.

The thicknesses $e_1$ and $e_2$ obtained at the end of the heat treatment depend on the duration of the heat treatment and/or the temperature applied and/or the pressure applied. Two examples are described below.

Taking a preferential example, the first contact layer 281 is made from $NiSi_2$ and the second layer 202 is made from silicon. The oxidation of the silicide (i.e. $NiSi_2$) is quicker than that of the silicon carried out at the same temperature and for the same duration of the heat treatment.

The heat treatment is carried out for example at a temperature of between 800° C. and 1200° C. and preferably between 700° C. and 900° C. In one example, the heat treatment is carried out at 700° C. for 20 hours so as to form the first and second sacrificial layers 271a and 271b respectively having a thickness of 50 nm and 17 nm.

In another example, the first contact layer 281 is made from CoSi$_2$ and the second layer 202 is made from silicon. The oxidation rate of the CoSi$_2$ is approximately twice that of Si at the same pressure.

A heat treatment is carried out for example at 1 torr for one hour so as to form the first and second sacrificial layers 271a and 271b respectively having a thickness of 36 nm and 18 nm.

In addition, because of the performance of this annealing, the thickness of a residual portion of the second layer 202 is effectively less than the thickness of the second layer 202 obtained at the end of step 220.

The invention is not limited to the method for producing the first and second sacrificial layers 271a and 271b.

Figure 2F:
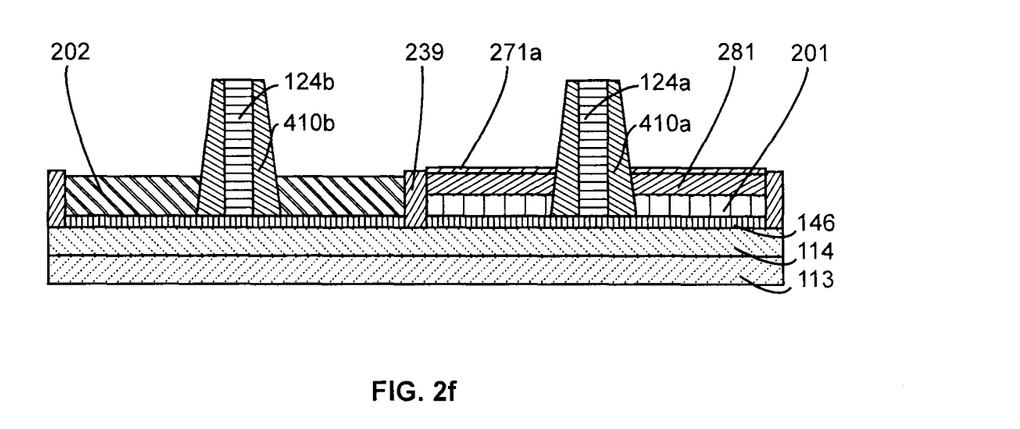

Step 270, consisting of completely removing the second sacrificial layer 271b and partially the first sacrificial layer 271a, is then performed so as to expose the residual portion of the second layer 202. At the end of step 270, an upper surface of the residual portion of the second layer 202 is thus bared, keeping in place a residual thickness of the first sacrificial layer 271a, as illustrated in FIG. 2f. The upper surface of the second residual portion is therefore ready for performing the following step 280 (described below) for forming a second metallic layer 207b.

Preferentially but non-limitatively, the two sacrificial layers 271a and 271b are removed by chemical attack such as dilute etching with hydrofluoric acid (HF) or etching with diverted plasma (NF$_3$, NH$_3$).

In addition, it is important to carefully choose the materials of the layers formed and the methods implemented in the above steps 220 to 260 and the removal method implemented at step 270 in order to ensure that the desired result of step 270 is obtained, that is to say the preservation of a residual portion part of the first sacrificial layer 271a. Furthermore, for this purpose, the thickness e$_1$ of the first sacrificial layer 271a obtained at the end of step 260 is preferentially but non-limitatively greater than the thickness e$_2$ of the second sacrificial layer 271b obtained. In this case, if the chemical attack of the two sacrificial layers 271a and 271b has the same kinetics, this difference in thickness ensures partial removal for the thickness e$_1$ and total removal for the thickness e$_2$.

The invention is not limited to the above method for removing the first and second sacrificial layers 271a and 271b.

Figure 2G:
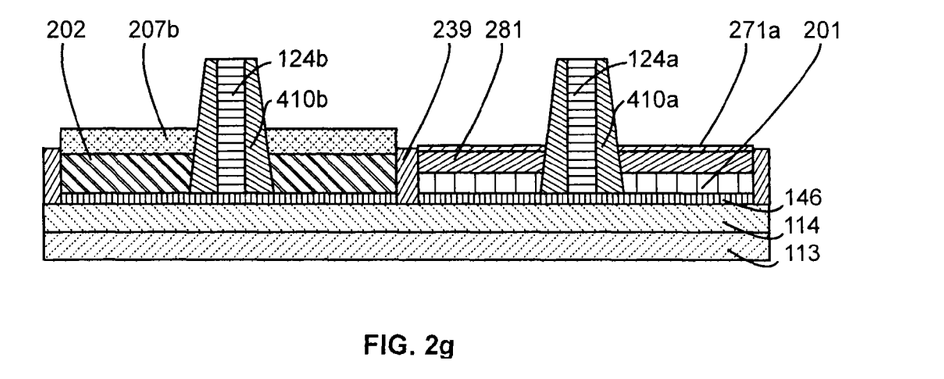

FIG. 2g shows the structure obtained at the end of the step 280 forming a second metallic layer 207b for the transistor 102. This step 280 consists of forming the second metallic layer 207b above the second residual portion of the second layer 202, preferentially but non-limitatively by non-assisted electrochemical method ("electroless deposition"). More precisely, there actually remains at this stage only one semiconductor region exposed on the plate, namely the second layer 202. The step 280 of forming the second metallic layer 207b can therefore be considered to be performed "auto-selectively".

In another embodiment, the second metallic layer 207b is produced non-selectively, for example by PVD, over the whole of the continuous upper surface of the wafer. As described below, there is then a step of partial removal of this deposit.

According to the present embodiment, the second metallic layer 207b is formed by selective deposition outside regions comprising dielectric regions of the top surface of the substrate 112 and those of the first sacrificial layer 271a; more precisely, the second metallic layer 207b is positioned above the second layer 202 of the second semiconductor material and formed around the stack of gates 160b instead of on dielectric elements such as the STIs 239, the spacers 410a, 410b, the hard masks covering the gates 124a, 124b and the first sacrificial layer 271a.

The thickness of the second metallic layer 207b is determined according to that of the second layer 202. More precisely, the thickness of the second metallic layer 207b should be sufficiently less than that of the second layer 202.

The thickness of the second metallic layer 207b is preferably greater than a threshold thickness (i.e. between 1 and 20 nm).

In order to determine said threshold thickness of the second metallic layer 207b, one possibility is to calculate the volume $V_{at}^i$ of an atom of the material for each layer i such as an upper portion (RI) of the second layer 202, the second metallic layer (CM) 207b, the second contact layer (CC) 282 (formed subsequently at step 290). The values $V_{at}^i$ for the above three layers are therefore respectively represented as $V_{at}^{RI}$, $V_{at}^{CM}$, $V_{at}^{CC}$.

The detailed description of the threshold thickness of the second metallic layer 207b is similar to that of the threshold thickness of the first metallic layer 207a as previously described, and can therefore be here adapted to an equivalent computation.

The features indicated in the description of steps 230 and 240, in particular with regard to thickness, choice of material and the method of forming the first metallic layer 207a, are valid for producing the second metallic layer 207b.

According to the nature of the second p-type layer 202, the output work of the silicide will be adjusted by advantageously adding to the second metallic layer 207b palladium or platinum for the second p-type layer 202 in a concentration range from 0% to 20%.

It should be noted that the first metallic layer 207a and the second metallic layer 207b may be made from different or identical materials, which depends on the desired characteristics (such as conductivity) of the transistors 101, 102.

Figure 2H:
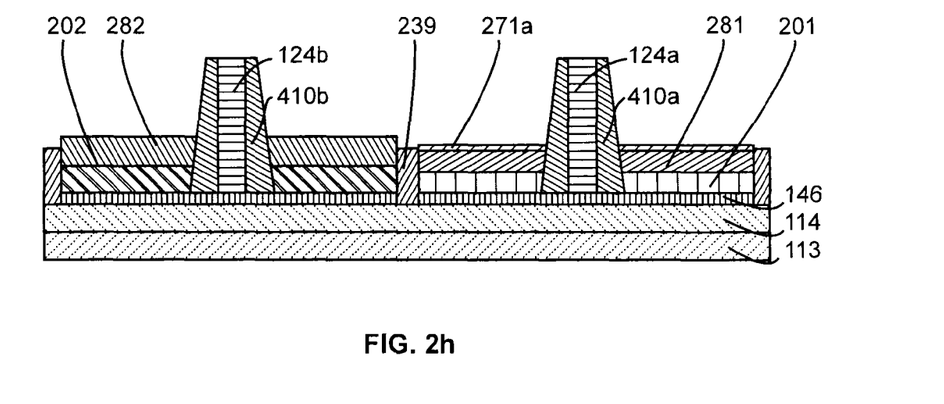

FIG. 2h shows the structure obtained at the end of the step 290 of forming a second contact layer 282 for the transistor 102. This contact layer 282 forms in general terms portions of devices, advantageously used for electrical conduction.

Step 290 consists of preferentially carrying out a heat treatment so as to form the second contact layer 282 of a second intermetallic compound or solid solution composed of the following two materials: the material of the second metallic layer 207b and the second semiconductor material of an upper portion of said residual portion of the second layer 202.

The description of the parameters of the annealing carried out at step 250 is valid for the performance of an annealing carried out at this step 290 so as to form the second contact layer 282.

Step 295 is an optional step performed in an embodiment where the second metallic layer 207b is formed at step 280 non-selectively. This step 295 consists of removing residual portions of the second metallic layer 207b and/or portions of the second contact layer 282 that are situated outside the second region; that is to say removing the portions of the second contact layer 282 situated above the STIs 239 and the first sacrificial layer 271a.

The invention is not limited to the above method of removing portions of the second contact layer 282 and residual portions of the second metallic layer 207b.

Figure 2I:
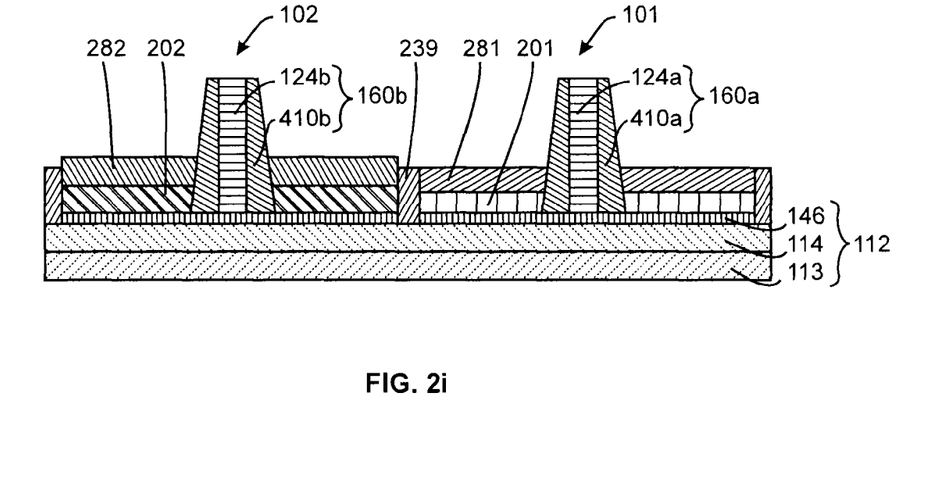

Step 300, consisting of completely removing the first sacrificial layer 271a, is then performed so as to expose the first contact layer 281, as illustrated in FIG. 2i.

Preferentially but non-limitatively, the first sacrificial layer 271a is removed by chemical attack such as dilute etching with hydrofluoric acid (HF) or by diverted-plasma etching ($NF_3$, $NH_3$).

It should be noted that this method of the invention can also be used for other applications such as hybrid III-V laser devices comprising two contact layers 281, 282 composed of different materials. The expression "III-V" relates, as mentioned above, to materials comprising at least one element forming part of the elements in columns Ill and V of the periodic classification of elements.

Briefly, the method of the invention can have the following advantages:

(1) Flexibility in the choice of the materials and in the choice of conductivities required for devices obtained: the invention makes it possible to form two metallic layers composed of identical or different materials, and to produce, consequently, two contact layers that comprise compositions that are partially or completely different, which improves the flexibility of choice of the materials for two metallic layers as well as the choice of the conductivities required for two contact layers and respectively for two transistors of different types.

(2) Flexibility in terms of the density of the patterns and reduced size of the devices.

(3) Optimisation of the parameters for forming the two metallic layers for a given substrate: this optimum will be different according to substrates in different materials. Characteristics such as the thickness and roughness of the two metallic layers deposited are also dependent on the superficial layer of the substrate employed on which they are deposited. In addition, the invention is flexible in terms of materials to be used since the materials of the metallic layers are less dependent on the material of the superficial layer of the substrate used.

(4) Flexibility in terms of depositions of the metallic layers in structures with a high aspect ratio (shape ratio).

(5) Reduction in the consumption of materials of the metallic layers and consequently simplification of the sequence for manufacturing the devices.

The invention is not limited to the embodiments described but extends to an embodiment covered by the claims.

The invention claimed is:

1. A method for manufacturing a microelectronic device on a substrate, comprising:
   forming a first layer of a first semiconductor material on a first region of a top surface of the substrate; and
   forming a second layer of a second semiconductor material on a second region, distinct from the first region, of the top surface of the substrate,
   the method further comprising, after the formation of the second layer:
   forming a first metallic layer above the first layer;
   forming a first contact layer of a first intermetallic compound or solid solution, the first contact layer comprising at least one portion of the first layer and at least one portion of the first metallic layer;
   forming a first sacrificial layer by oxidation, with a thickness $e_1$, in an upper portion of the first contact layer;
   forming a second sacrificial layer by oxidation, with a thickness $e_2$, in an upper portion of the second layer;
   removing all of the second sacrificial layer so as to expose a residual portion of the second layer;
   partially removing the first sacrificial layer;
   forming a second metallic layer above said residual portion; and
   forming a second contact layer of a second intermetallic compound or solid solution, the second contact layer comprising at least one portion of said residual portion and at least one portion of the second metallic layer.

2. The method according to claim 1, wherein the thickness $e_1$ of the first sacrificial layer is greater than the thickness $e_2$ of the second sacrificial layer.

3. The method according to claim 1, wherein the formations of the first and second sacrificial layers comprise respectively a performance of a heat treatment.

4. The method according to claim 3, wherein the heat treatment is carried out for a period of 2 to 100 hours and at a temperature of between 700° C. and 1200° C. so as to form the first and second sacrificial layers.

5. The method according to claim 1, comprising, after the formation of the second contact layer, a total removal of the first sacrificial layer.

6. The method according to claim 1, wherein the first and second sacrificial layers are removed by chemical attack.

7. The method according to claim 1, wherein the formations of the first and second contact layers comprise carrying out of a heat treatment.

8. The method according to claim 7, wherein the heat treatment is carried out for a period of 10 to 600 seconds and at a temperature of between 150° C. and 500° C. so as to form the first and second contact layers.

9. The method according to claim 1, wherein the first metallic layer and the second metallic layer are made from different materials.

10. The method according to claim 1, wherein the first semiconductor material and the second semiconductor material are different.

11. The method according to claim 10, wherein the first metallic layer is formed by selective deposition outside regions comprising dielectric regions of the top surface of the substrate and the second layer of the second semiconductor material.

12. The method according to claim 10, wherein the second metallic layer is formed by selective deposition outside regions comprising dielectric regions of the top surface of the substrate and those of the sacrificial layer.

13. The method according to claim 11, wherein at least one from among the first and second metallic layers is formed by non-assisted electrochemical method.

14. The method according to claim 1, wherein a thickness of the first metallic layer and that of the second metallic layer are greater than 5 nm.

15. The method according to claim 1, wherein at least one of the first and second semiconductor materials is chosen from the following materials: silicon, a solid solution of silicon containing carbon, a solid solution of silicon or germanium, germanium, silicon-germanium, or materials composed of elements from columns III and/or V of the standard periodic table of elements.

16. The method according to claim 1, wherein the first and second semiconductor materials are chosen from the following materials: silicon, a solid solution of silicon containing carbon, and a solid solution of silicon or germanium.

17. The method according to claim 1, wherein the first and second semiconductor materials are chosen from materials composed of elements from columns III and/or V of the standard periodic table of elements.

* * * * *